US010393838B2

(12) United States Patent
Hernando

(10) Patent No.: US 10,393,838 B2
(45) Date of Patent: Aug. 27, 2019

(54) METHOD FOR CORRECTING PHASE OFFSETS IN QUANTITATIVE CHEMICAL SHIFT ENCODED MAGNETIC RESONANCE IMAGING

(71) Applicant: Wisconsin Alumni Research Foundation, Madison, WI (US)

(72) Inventor: Diego Hernando, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 494 days.

(21) Appl. No.: 15/288,770

(22) Filed: Oct. 7, 2016

(65) Prior Publication Data

US 2018/0100910 A1  Apr. 12, 2018

(51) Int. Cl.
  *G01V 3/00* (2006.01)
  *G01R 33/48* (2006.01)
  *G01R 33/565* (2006.01)

(52) U.S. Cl.
  CPC ... *G01R 33/4828* (2013.01); *G01R 33/56554* (2013.01)

(58) Field of Classification Search
  CPC .................................. G01R 33/4828
  USPC .................................. 324/309, 307
  See application file for complete search history.

(56) References Cited

U.S. PATENT DOCUMENTS 9,625,549 B2 * 4/2017 Hernando .......... G01R 33/4828
9,943,246 B2 * 4/2018 Reeder .................. A61B 5/055
2017/0181656 A1 * 6/2017 Reeder .................. A61B 5/055
2017/0350951 A1 * 12/2017 Samsonov .......... G01R 33/485
2018/0321347 A1 * 11/2018 Wang ................. G01R 33/5608

OTHER PUBLICATIONS

Artz, et al., Reproducibility of MR-Based Liver Fat Quantification Across Field Strength: Same-Day Comparison Between 1.5T and 3T in Obese Subjects, Journal of Magnetic Resonance Imaging, 2015, 42(3):811-817.
Hansen, et al., Robustness of Fat Quantification Using Chemical Shift Imaging, Magnetic Resonance Imaging, 2012, 30(2):151-157.
Hernando, et al., Chemical Shift-Based Water/Fat Separation: A Comparison of Signal Models, Magnetic Resonance in Medicine, 2010, 64:811-822.
Kang, et al., Reproducibility of MRI-Determined Proton Density Fat Fraction Across Two Different MR Scanner Platforms, Journal of Magnetic Resonance Imaging, 2011, 34(4):928-934.
Levin, et al., The Effect of Echo-Sampling Strategy on the Accuracy of Out-Of-Phase and In-Phase Multi-Echo Gradient-Echo Magnetic Resonance Imaging Hepatic Fat Fraction Estimation, Journal of Magnetic Resonance Imaging, 2014, 39(3):567-575.
Mashhood, et al., Reproducibility of Hepatic Fat Fraction Measurement by Magnetic Resonance Imaging, Journal of Magnetic Resonance Imaging, 2013, 37:1359-1370.
Yu, et al., Phase and Amplitude Correction for Multi-Echo Water-Fat Separation With Bipolar Acquisitions, Journal of Magnetic Resonance Imaging, 2010, 31(5):1264-1271.

* cited by examiner

*Primary Examiner* — Louis M Arana
(74) *Attorney, Agent, or Firm* — Quarles & Brady LLP

(57) ABSTRACT

Systems and methods for correcting phase errors in chemical shift encoded data are described. The technique is self-calibrated, without the need for specialized calibration data, and therefore may enable fat and iron quantification using data from clinical and research sites that do not have specialized pulse sequences.

14 Claims, 3 Drawing Sheets

METHOD FOR CORRECTING PHASE OFFSETS IN QUANTITATIVE CHEMICAL SHIFT ENCODED MAGNETIC RESONANCE IMAGING

STATEMENT REGARDING FEDERALLY SPONSORED RESEARCH

This invention was made with government support under DK083380, DK088925, DK100651, and DK102595 awarded by the National Institutes of Health. The government has certain rights in the invention.

BACKGROUND OF THE INVENTION

Emerging MRI-based quantitative imaging biomarkers for fat and iron deposition are based on chemical shift encoded techniques. In these techniques, multiple images are acquired at increasing echo times, and quantification of fat and iron is performed by parametric fitting of the acquired data (e.g., to measure proton-density fat-fraction and $R_2^*$, which are biomarkers for tissue triglyceride and iron deposition, respectively).

Often, images are acquired using MRI pulse sequences that include bipolar readout gradients, where consecutive echo times are obtained with opposite gradient readout polarities. Bipolar acquisitions are very common because they allow more efficient use of acquisition time compared to monopolar pulse sequences, where all the echoes are acquired with the same gradient readout polarity (e.g., by inserting "flyback" gradients in between). Unfortunately, bipolar pulse sequences result in phase errors between the images obtained with different gradient polarities (i.e., even versus odd echoes). These phase errors can result in large errors in the quantification of fat and iron.

Specialized pulse sequences can be used to correct for these phase errors. In these specialized pulse sequences, additional calibration data are acquired, which enables calibration and correction of phase errors. However, these specialized pulse sequences are not widely available, partly due to their relatively high cost. Therefore, many sites only have standard pulse sequences, which suffer from phase errors, which complicates the widespread application of emerging fat and iron quantification techniques.

Thus, there remains a need to provide methods for quantitative chemical shift encoded MRI that automatically corrects for the phase errors associated with bipolar readout gradients, or that otherwise produces quantitative maps not affected by such errors.

SUMMARY OF THE INVENTION

The present disclosure overcomes the aforementioned drawbacks by providing a method for correcting phase errors in chemical shift encoded data acquired with a magnetic resonance imaging ("MRI") system. The method includes acquiring chemical shift encoded data from a subject using an MRI system operating a pulse sequence that includes bipolar readout gradients. First complex-valued estimates of a water image, a fat image, and a field map are generated using a complex fitting of the acquired chemical shift encoded data. In some examples, the complex fitting can include a spatial smoothness regularization of the field map estimate to avoid water-fat swaps and to preserve a full dynamic range. The initial complex-valued estimates are indicative of a proton density fat fraction dynamic range of zero to one hundred percent. Magnitude estimates of a water image and a fat image are then generated independently on a voxel-by-voxel basis using a magnitude fitting of the acquired chemical shift encoded data in which the first complex-valued estimates of the water image and the fat image are used as initial values. Second complex-valued estimates of a water image and a fat image are also generated independently on a voxel-by-voxel basis using a complex fitting of the acquired chemical shift encoded data in which the first complex-valued estimates of the water image, the fat image, and the field map are used as initial values. A phase-corrected water image and a phase-corrected fat image are then generated by estimating linear phase offsets associated with even-numbered echoes acquired in the chemical shift encoded data with the bipolar readout gradients. The linear phase offsets are estimated based on minimizing an objective function that includes a difference between the magnitude estimates of the water image and the fat image and the second complex-valued estimates of the water image and the fat image. A proton density fat fraction map is then generated based on the phase-corrected water image and the phase-corrected fat image It is another aspect of the present disclosure to provide a method for producing a proton density fat fraction map from chemical shift encoded data acquired with an MRI system. Chemical shift encoded data are acquired from a subject using an MRI system operating a pulse sequence that includes monopolar readout gradients. In some examples, the pulse sequence includes acquiring data with two separate echo trains. Initial complex-valued estimates of a water image and a fat image are generated using a complex fitting of the acquired chemical shift encoded data. The initial complex-valued estimates are indicative of a proton density fat fraction dynamic range of zero to one hundred percent. Magnitude estimates of a water image and a fat image are then generated independently on a voxel-by-voxel basis using a magnitude fitting of the acquired chemical shift encoded data in which the initial complex-valued estimates of the water image and the fat image are used as initial values. A proton density fat fraction map is then generated based on the magnitude estimates of the water image and the fat image.

The foregoing and other aspects and advantages described in the present disclosure will appear from the following description. In the description, reference is made to the accompanying drawings that form a part hereof, and in which there is shown by way of illustration a preferred embodiment. This embodiment does not necessarily represent the full scope of the invention, however, and reference is made therefore to the claims and herein for interpreting the scope of the invention.

DETAILED DESCRIPTION

Described here are systems and methods for correcting phase errors in chemical-shift encoded data acquired with magnetic resonance imaging ("MRI"). As one example, phase errors in chemical shift encoded data can be corrected to improve the accuracy of fat quantification or iron quantification based on the phase-corrected data. Current phase correction methods acquire additional phase correction data, but the ability to acquire this additional phase correction data is not available on all MRI systems. The systems and methods described here, however, can be implemented independent of the MRI system configuration and, thus, enable accurate fat and iron quantification even in systems that do not possess specialized pulse sequences.

Figure 1:
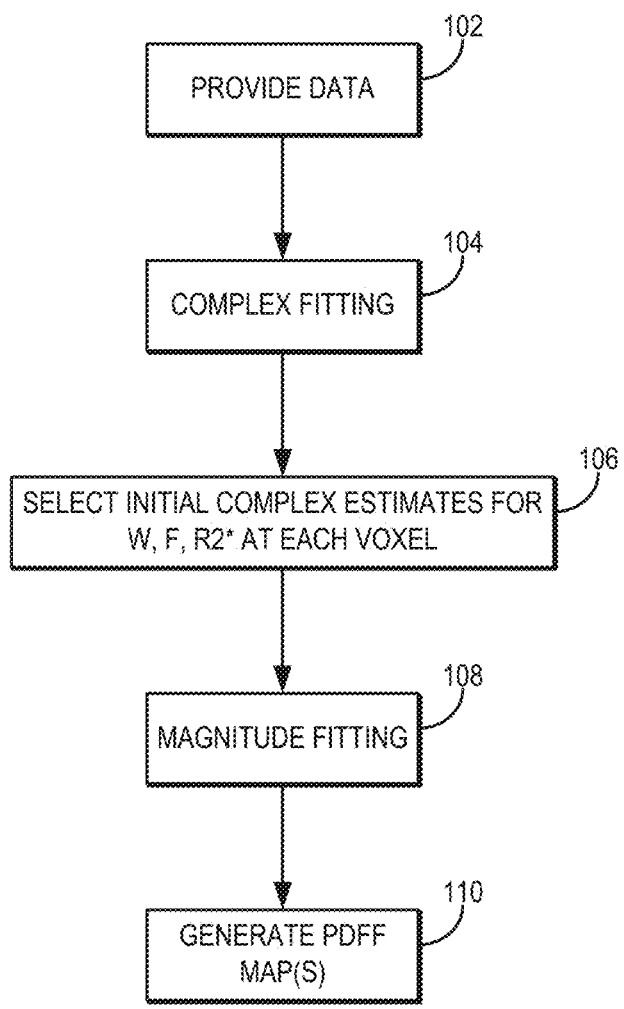
FIG. 1 is a flowchart setting forth the steps of an example method for generating a proton density fat fraction map from chemical shift encoded data acquired using a pulse sequence that implements monopolar readout gradients.

Referring now to FIG. 1, a flowchart is illustrated as setting forth the steps of an example method for producing a proton density fat fraction ("PDFF") map from chemical-shift encoded data acquired with an MRI system implementing a data acquisition with monopolar gradients.

The method includes providing acquired data to a computer system, as indicated at step 102. The data can be provided to the computer system be retrieving previously acquired data from a data storage, or by actively acquiring the data using an MRI system. The provided data can include complex-valued images, and in some examples can include k-space data from which complex-valued images can be reconstructed.

The PDFF map is generally produced using a two-step process to avoid phase errors in the PDFF estimation. First, a complex fitting is performed to obtain an approximate water-fat separation with a full 0-100 percent PDFF range, as indicated at step 104. In an example, the complex fitting can implement a spatial smoothness regularization of the field map estimate to avoid water-fat swaps and to preserve the full 0-100 PDFF dynamic range. As a result of this complex fitting, initial values of water signal amplitudes, W, fat signal amplitudes, F, and transverse relaxation rate, $R_2^*$, are estimated at each voxel in the field-of-view represented by the provided data. These estimate values are selected as initial values for a subsequent magnitude fitting, as indicated at step 106.

As mentioned above, in one example, the complex fitting can be performed using a regularized $B_0$ field map estimation approach with a graph-cuts based algorithm. This initial complex fitting provides a PDFF dynamic range of 0-100 percent, while avoiding artifactual discontinuities in the estimated $B_0$ field map, which can result in erroneous assignments of the fat and water signals (i.e., fat-water swaps).

The initial estimates of W, F, and $R_2^*$ are then used to initialize a magnitude fitting, which is performed as indicated at step 108. As a result of the magnitude fitting, updated values for W, F, and $R_2^*$ are generated at each voxel in the field-of-view. As one example, magnitude fitting can be performed using a voxel-by-voxel nonlinear least-squares algorithm (initialized with the complex fitting results from the previous step) to obtain fat-only magnitude images, water-only magnitude images, and $R_2^*$ maps. That is, these images can be generated independently at each voxel in the field-of-view.

One or more PDFF maps are then generated using the results of the magnitude fitting, as indicated at step 110. For example, PDFF maps can be calculated from the fat-only and water-only images using magnitude discrimination to avoid noise bias effects.

When bipolar gradients are used to acquire the chemical-shift encoded data, additional phase offsets are imparted to data acquired from even-numbered echoes. Similarly, when a pulse sequence with unequal echo spacing is used, linear phase errors can be present in the echoes. Likewise, other multi-echo pulse sequences can result in the presence of linear phase errors all or some of the echoes. Thus, in these implementations, additional phase corrections should be implemented.

Figure 2:
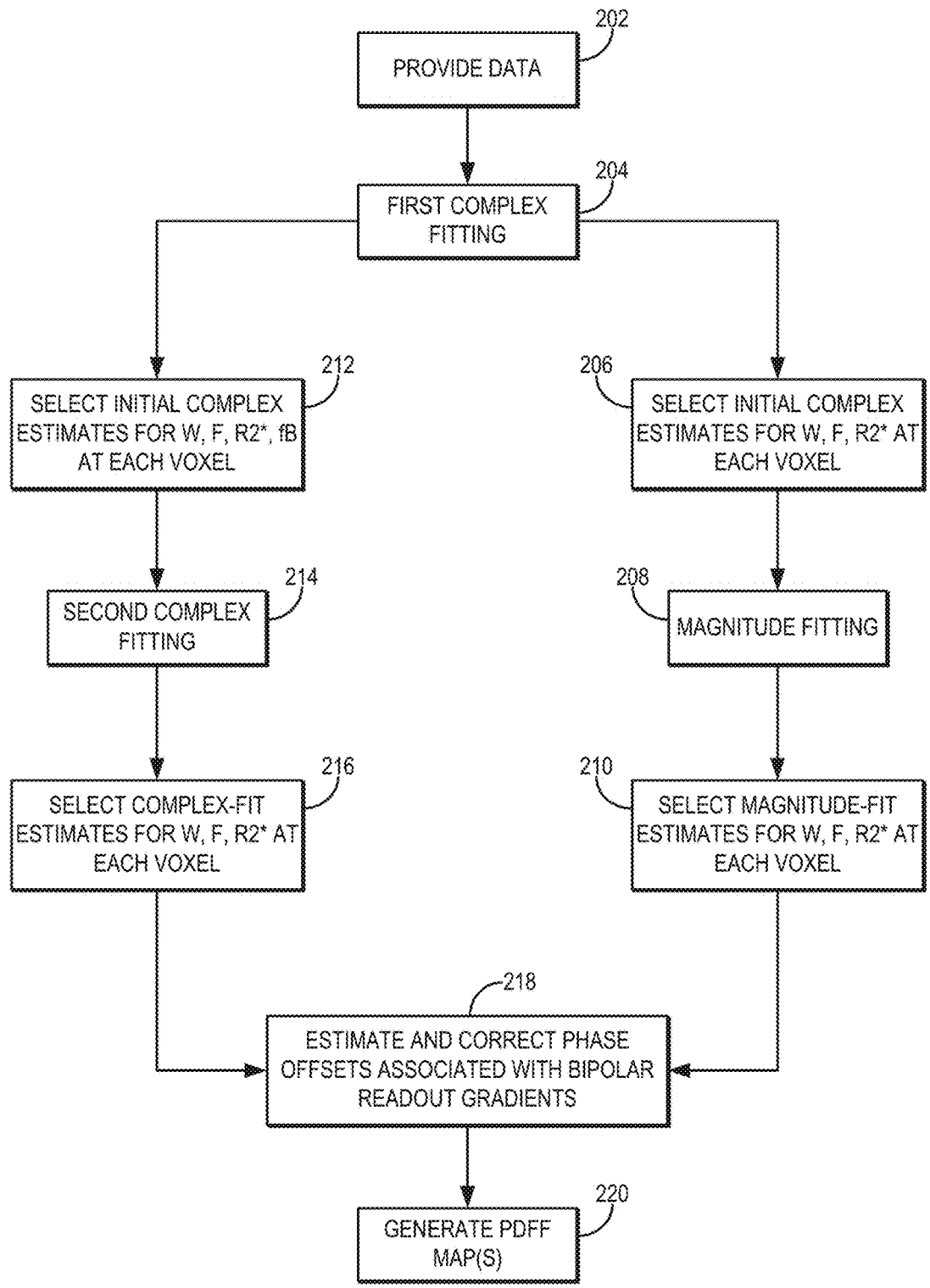
FIG. 2 is a flowchart setting forth the steps of an example method for generating a proton density fat fraction map from chemical shift encoded data acquired using a pulse sequence that implements bipolar readout gradients, in which phase offsets associated with the bipolar readout gradients are automatically corrected for without needing additional calibration data.

Referring now to FIG. 2, a flowchart is illustrated at setting forth the steps of an example method for generating PDFF maps from chemical-shift encoded data acquired with an MRI system implementing a multi-echo data acquisition that induces linear phase errors in one or more different echoes. In some examples, these phase errors can be attributed to linear phase offsets associated with even-numbered echoes when bipolar readout gradients are implemented. In some other examples, these phase errors can be attributed to unequal spacing between echoes. The method includes providing the acquired data to a computer system, as indicated at step 202. The data can be provided to the computer system be retrieving previously acquired data from a data storage, or by actively acquiring the data using an MRI system. The provided data can include complex-valued images, and in some examples can include k-space data from which complex-valued images can be reconstructed.

Like the method for monopolar gradient acquisitions described above, the method includes performing a first complex fitting, as indicated at step 204, to select initial estimates of W, F, and $R_2^*$ values at each voxel in the field-of-view represented by the provided data, as indicated at step 206. As one example, the first complex fitting can be performed using a regularized $B_0$ field map estimation approach with a graph-cuts based algorithm. This initial complex fitting provides a PDFF dynamic range of 0-100 percent, while avoiding artifactual discontinuities in the estimated $B_0$ field map, which can result in erroneous assignments of the fat and water signals (i.e., fat-water swaps).

Similar to the method for monopolar gradient acquisitions descried above, these initial estimates will be used to initialize a magnitude fitting, which is performed as indicated at step 208. As a result of the magnitude fitting, updated values for W, F, and $R_2^*$ are generated at each voxel in the field-of-view, as indicated at step 210. As one example, magnitude fitting can be performed using a voxel-by-voxel nonlinear least-squares algorithm (initialized with the complex fitting results from the previous step) to obtain fat-only magnitude images, water-only magnitude images, and $R_2^*$ maps. That is, these images can be generated independently at each voxel in the field-of-view.

The first complex fitting also generates an estimate of a field map, $f_B$, at each voxel in the field-of-view, which is selected along with the initial estimates of W, F, and $R_2^*$ values, as indicated at step 212, to initialize a second complex fitting, which is performed as indicated at step 214. As a result of the second complex fitting, updated values for W, F, and $R_2^*$ are generated at each voxel in the field-of-view, as indicated at step 216. As one example, complex fitting can be performed using a voxel-by-voxel nonlinear least-squares algorithm (initialized with the complex fitting results from the previous step) to obtain complex-valued fat-only image, water-only images, and $R_2^*$ maps. That is, these images can be generated independently at each voxel in the field-of-view.

For bipolar readout acquisitions, linear phase offsets are applied to even-numbered echoes. These phase offsets, which can be modeled as, $$\phi(x) = \phi_0 + x \cdot \phi_1 \qquad (1);$$

where x is the readout direction, can be estimated and automatically corrected as indicated at step 218. As one example, water and fat images that minimize the phase offsets can be selected by minimizing the difference (e.g., a root sum of squares over the entire images) in water and fat amplitude values estimated using a magnitude fitting between those estimated using a complex fitting:

$$\min_{\phi_0, \phi_1} \left\{ \sum_{q \text{ s.t. } R_{2,q}^* < 100 s^{-1}} [(|W_{q,complex}| - |W_{q,mag}|)^2 + (|F_{q,complex}| - |F_{q,mag}|)^2] \right\}; \qquad (2)$$

where $W_{q,complex}$ and $W_{q,mag}$ are the estimates of water signal at a voxel, q, using complex and magnitude fitting, respectively; $F_{q,complex}$ and $F_{q,mag}$ are the estimates of fat signal at the voxel, q, using complex and magnitude fitting, respectively; and $R_{2,q}^*$ is the transverse relaxation rate, $R_2^* = 1/T_2^*$, estimated at the voxel, q, using magnitude fitting.

Advantageously, the phase correction algorithm can be restricted to voxels with moderate values of $R_2^*$ (e.g., R less than about 100 $s^{-1}$) to avoid unstable phase correction due to noisy voxels, where $R_2^*$ can be arbitrarily high. Using this phase correction algorithm, phase error reductions sufficient to enable complex fitting with no more than moderate errors over the entire PDFF range of 0-100 percent can be achieved. In some implementations, the phase error reduced estimates can be used to initialize a subsequent magnitude fitting, such as those described above.

After phase correction, one or more PDFF maps are then generated using the phase-corrected images, as indicated at step 220. For example, PDFF maps can be calculated from the phase corrected fat-only and water-only images using magnitude discrimination to avoid noise bias effects. As another example, PDFF maps can be calculated from complex-valued, phase-corrected images using a reconstruction that may include corrections for the multi-peak fat spectrum, $T_2^*$ relaxation (e.g., assuming a single $T_2^*$ that is common for water and fat), and temperature-related frequency shifts.

Figure 3:
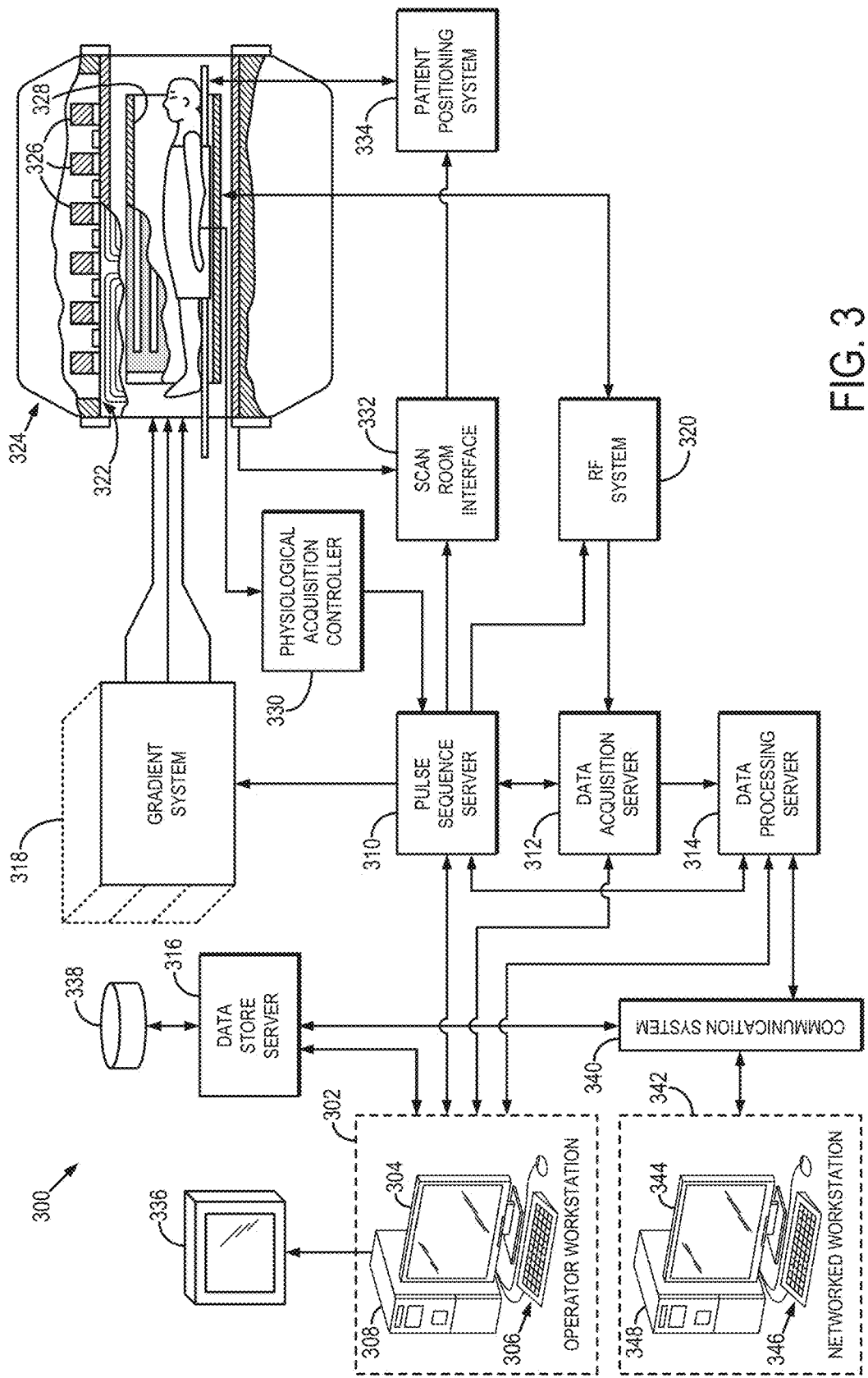
FIG. 3 is a block diagram of a magnetic resonance imaging ("MRI") system.

Referring particularly now to FIG. 3, an example of an MRI system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for correcting phase errors in chemical shift encoded data acquired with a magnetic resonance imaging (MRI) system, the steps of the method comprising:
   (a) acquiring chemical shift encoded data from a subject using an MRI system operating a pulse sequence that induces linear phase errors in multiple different echoes;
   (b) generating first complex-valued estimates of a water image, a fat image, and a field map using a complex fitting of the acquired chemical shift encoded data, wherein the initial complex-valued estimates are indicative of a proton density fat fraction dynamic range of zero to one hundred percent;
   (c) generating magnitude estimates of a water image and a fat image independently on a voxel-by-voxel basis using a magnitude fitting of the acquired chemical shift encoded data in which the first complex-valued estimates of the water image and the fat image are used as initial values;
   (d) generating second complex-valued estimates of a water image and a fat image independently on a voxel-by-voxel basis using a complex fitting of the acquired chemical shift encoded data in which the first complex-valued estimates of the water image, the fat image, and the field map are used as initial values;
   (e) producing a phase-corrected water image and a phase-corrected fat image by estimating linear phase offsets associated with the linear phase errors induced by the pulse sequence, wherein estimating the linear phase offsets is based on minimizing an objective function that includes a difference between the magnitude estimates of the water image and the fat image and the second complex-valued estimates of the water image and the fat image; and
   (f) generating a proton density fat fraction map based on the phase-corrected water image and the phase-corrected fat image.

2. The method as recited in claim 1, wherein step (b) further includes generating an initial complex-valued estimate of a parameter map and step (c) includes generating a magnitude estimate of the parameter map using the magnitude fitting in which the initial complex-valued estimate of the parameter is also used as an initial value.

3. The method as recited in claim 2, wherein the parameter map is a transverse relaxation parameter map.

4. The method as recited in claim 3, wherein the parameter map is a transverse relaxation rate ($R_2^*$) map.

5. The method as recited in claim 4, wherein minimizing the objective function in step (e) is restricted to only minimize voxels having transverse relaxation rate values less than a threshold value.

6. The method as recited in claim 5, wherein the threshold value is 100 per seconds ($s^{-1}$).

7. The method as recited in claim 4, wherein the objective function minimized in step (e) is, $$\min_{\phi_0,\phi_1}\left\{\sum_{q\ s.t.\ R_{2,q}^*<T}[(|W_{q,complex}|-|W_{q,mag}|)^2+(|F_{q,complex}|-|F_{q,mag}|)^2]\right\};$$

wherein $\phi_0$ and $\phi_1$ are the linear phase offsets; $W_{q,complex}$ is the second complex-valued estimate of the water image at voxel q; $W_{q,mag}$ is the magnitude estimate of the water image at voxel q; $F_{q,complex}$ is the second complex-valued estimate of the fat image at voxel q; $F_{q,mag}$ is the magnitude estimate of the fat image signal at voxel q; $R_{2,q}^*$ is the transverse relaxation rate at voxel q; and T is the threshold value.

8. The method as recited in claim 7, wherein the threshold value is 100 per seconds ($s^{-1}$).

9. The method as recited in claim 1, wherein the pulse sequence includes bipolar readout gradients and the linear phase errors induced by the pulse sequence includes linear phase offsets associated with even-numbered echoes acquired in the chemical shift encoded data with the bipolar readout gradients.

10. The method as recited in claim 1, wherein the pulse sequence includes forming unequally spaced echoes and the linear phase errors induced by the pulse sequence includes linear phase offsets associated with the unequally spaced echoes.

11. A method for producing a proton density fat fraction map from chemical shift encoded data acquired with a magnetic resonance imaging (MRI) system, the steps of the method comprising:

(a) acquiring chemical shift encoded data from a subject using an MRI system operating a pulse sequence that includes monopolar readout gradients;

(b) generating initial complex-valued estimates of a water image and a fat image using a complex fitting of the acquired chemical shift encoded data, wherein the initial complex-valued estimates are indicative of a proton density fat fraction dynamic range of zero to one hundred percent;

(c) generating magnitude estimates of a water image and a fat image independently on a voxel-by-voxel basis using a magnitude fitting of the acquired chemical shift encoded data in which the initial complex-valued estimates of the water image and the fat image are used as initial values; and (d) generating a proton density fat fraction map based on the magnitude estimates of the water image and the fat image.

12. The method as recited in claim 11, wherein step (b) further includes generating an initial complex-valued estimate of a parameter map and step (c) includes generating a magnitude estimate of the parameter map using the magnitude fitting in which the initial complex-valued estimate of the parameter is also used as an initial value.

13. The method as recited in claim 12, wherein the parameter map is a transverse relaxation parameter map.

14. The method as recited in claim 13, wherein the parameter map is a transverse relaxation rate ($R_2^*$) map.

* * * * *